United States Patent [19]
Miida et al.

[11] Patent Number: 5,252,868
[45] Date of Patent: Oct. 12, 1993

[54] CMOS AMPLIFIER CIRCUIT AND CCD DELAY LINE WITH CMOS AMPLIFIER CIRCUIT

[75] Inventors: Takashi Miida; Tatsuya Hagiwara; Yasumasa Hasegawa, all of Kanagawa, Japan

[73] Assignee: Fuji Photo Film Co., Ltd., Kanagawa, Japan

[21] Appl. No.: 764,512

[22] Filed: Sep. 20, 1991

[30] Foreign Application Priority Data

Sep. 25, 1990 [JP] Japan ................... 2-251851

[51] Int. Cl.[5] .................. H03K 5/13; H03K 5/153
[52] U.S. Cl. ..................... 307/607; 307/358; 307/359; 307/264; 307/491; 377/58; 377/60; 330/253; 330/260
[58] Field of Search ................. 377/58, 60; 307/358–359, 264, 491, 607; 357/24 LR; 330/253, 260; 257/236, 238

[56] References Cited
U.S. PATENT DOCUMENTS 4,075,515  2/1978  Hoffmann ................ 307/607

FOREIGN PATENT DOCUMENTS 0037823  2/1990  Japan .................... 307/264

OTHER PUBLICATIONS

IBM Tech. Disc. Bul "CCD Floating Diffusion Output Tap" vol. 25 No. 11B Apr. 1983, Schlig.
IEEE Journal of Solid-State Circuits, vol. SC-16, No. 5, Oct. 1981, "CCD Memory Using Multilevel Storage" Terman et al.

Primary Examiner—Margaret R. Wambach

[57] ABSTRACT

A CCD amplifier circuit including an active load type source-grounded inverting amplifier circuit which includes a driving MOS transistor, an active load MOS transistor connected to the driving MOS transistor, and a control circuit. The control circuit controls the voltage at the gate electrode of the active load MOS transistor with a control signal of low output impedance which is substantially inversely proportional to the drain-source voltage of the active load MOS transistor and level-shifted by a predetermined voltage. Further, a CCD delay line includes a floating diffusion region of predetermined impurities formed at an end of a charge-coupled device with a gate section having a predetermined fixed gate voltage, and a switched capacitor integrator for detecting the injection charge of the floating diffusion region to detect signal charges transferred to the floating diffusion region from the charge-coupled device. The CCD amplifier circuit is employed as an output circuit of the switched capacitor integrator.

20 Claims, 5 Drawing Sheets

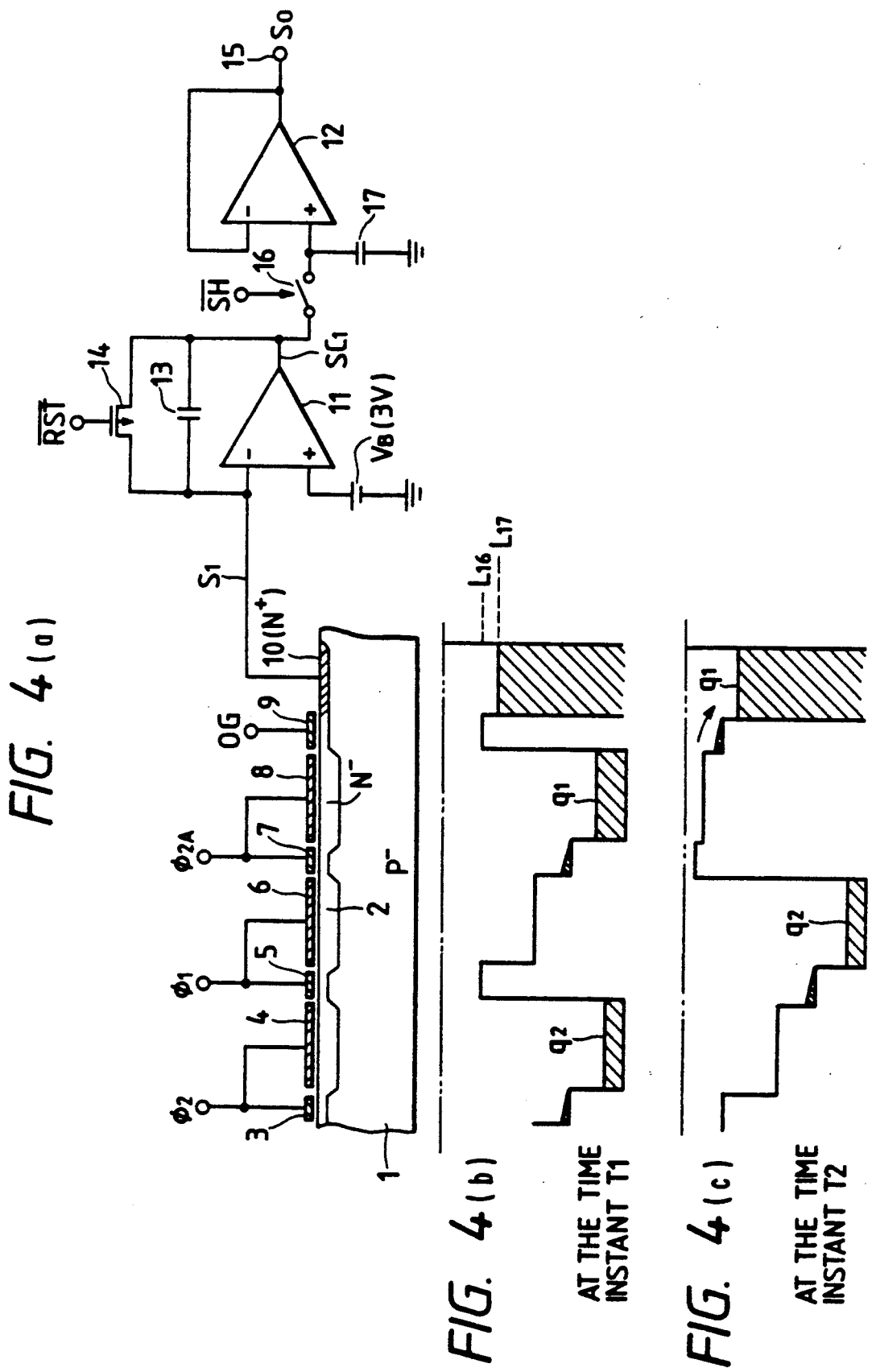

CMOS AMPLIFIER CIRCUIT AND CCD DELAY LINE WITH CMOS AMPLIFIER CIRCUIT

BACKGROUND OF THE INVENTION

The present invention relates to a CMOS amplifier circuit formed by a CMOS semiconductor process, and to an output circuit of a charge-coupled device (CCD) delay line which includes the CMOS amplifier circuit.

Recently, integrated circuit devices (ICs and LSICs) formed by a CMOS semiconductor process have been extensively employed because they have excellent characteristics. Namely, CMOS circuits have a wide operating voltage range and are low in power consumption. CMOS amplifier circuits formed by a CMOS semiconductor process are applied to internal signal amplifier circuits, output power amplifier circuits, and so forth.

A CMOS amplifier circuit AMP shown in FIG. 7 is known in the art. Specifically, the CMOS amplifier circuit is an active load type source-grounded inverting amplifier circuit. A P-channel MOS transistor $Q_1$ serving as an active load has its gate and source electrodes connected together. An N-channel MOS transistor $Q_2$ is connected between a high voltage source $V_{CC}$ and a low voltage source $V_{EE}$ ($V_{CC} > V_{EE}$). A signal $V_G$ is applied to the gate electrode of the MOS transistor $Q_2$ and subjected to inversion and amplification to provide an output signal $V_0$ at the common connecting point of the transistors $Q_1$ and $Q_2$.

It is assumed that the mutual conductance of the MOS transistor $Q_1$ is represented by $g_{mL}$, the resistance between the drain and the source thereof is represented by $r_{dsL}$, the mutual conductance of the MOS transistor $Q_2$ is represented by $g_{mD}$, and the resistance between the drain and the source thereof is represented by $r_{dsD}$. Hence, the output impedance $Z_0$ of the amplifier circuit is as follows:

$$Z_0 = \frac{\frac{r_{dsL} \times r_{dSD}}{r_{dsL} + r_{dSD}}}{1 + g_{mL} \times \left( \frac{r_{dsL} \times r_{dSD}}{r_{dsL} + r_{dSD}} \right)} \quad (1)$$

The voltage amplification factor $A_V$ is as follows:

$$A_V = V_0/V_G = -g_{mD} \times Z_0 \quad (2)$$

In the amplifier circuit, the parallel resistance of $r_{dsL}$ and $r_{dsD}$ has the following relationship:

$$(r_{dsL} \times r_{dsD})/(r_{dsL} + r_{dsD}) > 1/g_{mL} \quad (3)$$

Therefore, in above-described equation (2), the voltage amplification factor $A_V$, can be rewritten as follows:

$$A_V \approx -g_{mD}/g_{mL} \quad (4)$$

The above-described CMOS amplifier circuit is advantageous over a source-grounded inverting amplifier circuit in that it can be lower in impedance and it can be miniaturized.

The signal $V_G$ applied to the gate electrode of the MOS transistor $Q_2$ is generally supplied from a differential amplifier as shown in FIG. 7. The differential amplifier includes N-channel MOS transistors $Q_3$ and $Q_4$ forming a differential pair a constant current circuit $I_0$, and P-channel MOS transistors $Q_5$ and $Q_6$ forming an active load. An input signal $V_I$ from various circuits (not shown) is applied to the gate electrode of the MOS-transistor $Q_3$.

The amplifier circuit can also be employed as a voltage follower circuit which has improved linearity with the output signal $V_0$ fed back to the gate electrode of the MOS transistor $Q_4$ on the non-inverting input side of the differential amplifier.

However, the above-described conventional amplifier circuit suffers from certain problems and disadvantages which are discussed below.

First, as shown in FIG. 8, the threshold voltage $V_{th}$ of the MOS transistor $Q_1$ connected to the high voltage source $V_{CC}$ causes compression of the output DC dynamic range on the side of $V_{CC}$.

Second, in the case where the CMOS amplifier circuit is used as a buffer amplifier where a plurality of circuits are connected to it in subsequent stages, it is desirable that the output impedance $Z_0$ be low. However, since the voltage of the output signal $V_0$ is increased with the decreasing voltage of the input signal $V_G$ of the MOS transistor $Q_2$, the bias voltage $V_{GS}$ between the gate and the source of the MOS transistor $Q_1$ is decreased, and the mutual conductance $g_{mL}$ is also decreased. Therefore, as is apparent from the above equations (2) and (4), as the mutual conductance $g_{mL}$ decreases, the output impedance $Z_0$ increases. As the output impedance $Z_0$ increases in this manner, the high-frequency cut-off frequency $f_H$ is decreased. As a result, the circuit may become unstable, resulting in undesirable oscillation.

Third, the capacitance between the gate and the drain of the MOS transistor $Q_1$ forms a capacitive load on the MOS transistor $Q_2$. Hence, the high-frequency cut-off frequency $f_H$ is lowered by the capacitive load, thus making it difficult to increase the bandwidth of the circuit.

SUMMARY OF THE INVENTION

In view of the foregoing an object of the invention is to provide an active load type source-grounded inverting amplifier circuit which is superior to conventional active load type source-grounded inversion amplifier circuits in both dynamic range and bandwidth.

Another object of the invention is to provide a CCD delay line with excellent characteristics and which has a CCD amplifier circuit as its output circuit. When employing a charge-coupled device (CCD) as a video signal delay line, it is essential to employ an output circuit which has a wide frequency band and a low output impedance.

The foregoing objects and other objects of the invention have been achieved by the provision of a CCD amplifier circuit including an active load type inverting amplifier circuit which includes a driving MOS transistor, an active load MOS transistor connected to the driving MOS transistor, and a control circuit for controlling the voltage at the gate electrode of the active load MOS transistor with a control signal so as to provide low output impedance, the control signal being substantially inversely proportional to the drain-source voltage of the active load MOS transistor and is level-shifted by a predetermined voltage.

In an example of the CCD amplifier circuit, the gate electrode of an active load MOS transistor is driven by the output of a drain-grounded buffer circuit having a gate electrode to which the drain-source voltage of the active load MOS- transistor is applied, and having a source electrode which is connected to a constant current source.

In addition, in a CCD delay line in which a floating diffusion region of predetermined impurities is formed at the end of a charge-coupled device with a gate section having a predetermined fixed gate voltage, and a switched capacitor integrator for detecting the injection charge of the floating diffusion region is provided so as to detect signal charges transferred to the floating diffusion region from the charge-coupled device. The above-described CCD amplifier circuit is employed in an output circuit of the switched capacitor integrator.

In the CCD amplifier circuit thus constructed, even when the output signal increases in voltage amplitude, neither the mutual conductance of the active load MOS transistor nor the pinch-off voltage is decreased because a forward bias voltage is applied between the gate and source electrodes of the active load MOS transistor at all times.

Furthermore, because the gate capacitance of the active load MOS transistor is charged by a control signal of a low output impedance control circuit, it does not become a capacitive load on the driving MOS transistor. Hence, the amplitude of the output signal is not collapsed by the effect of a pinch-off voltage, that is, the dynamic range is increased. In addition, as is apparent from the above expressions (1) and (4), the output impedance does not increase, while the high-frequency cut-off frequency is increased. Thus, the resultant CCD amplifier circuit has a wide bandwidth.

A CCD delay line capable of processing video signals having a wide bandwidth can be realized by applying the CCD amplifier to an output circuit thereof.

BRIEF DESCRIPTION OF THE DRAWINGS

The invention will be more clearly understood from the following description in conjunction with the accompanying drawings, wherein:

FIG. 4A is a schematic diagram of an example of a CCD delay line according to the invention;

FIGS. 4B and 4C are explanatory diagrams for the operation of the example of a CCD delay line illustrated in FIG. 4A;

DETAILED DESCRIPTION OF THE PREFERRED EMBODIMENTS

An example of a CCD amplifier circuit, which constitutes an embodiment of the invention, will be described with reference to the accompanying drawings.

First, the arrangement of the CCD amplifier circuit will be described with reference to FIG. 1.

Figure 1:
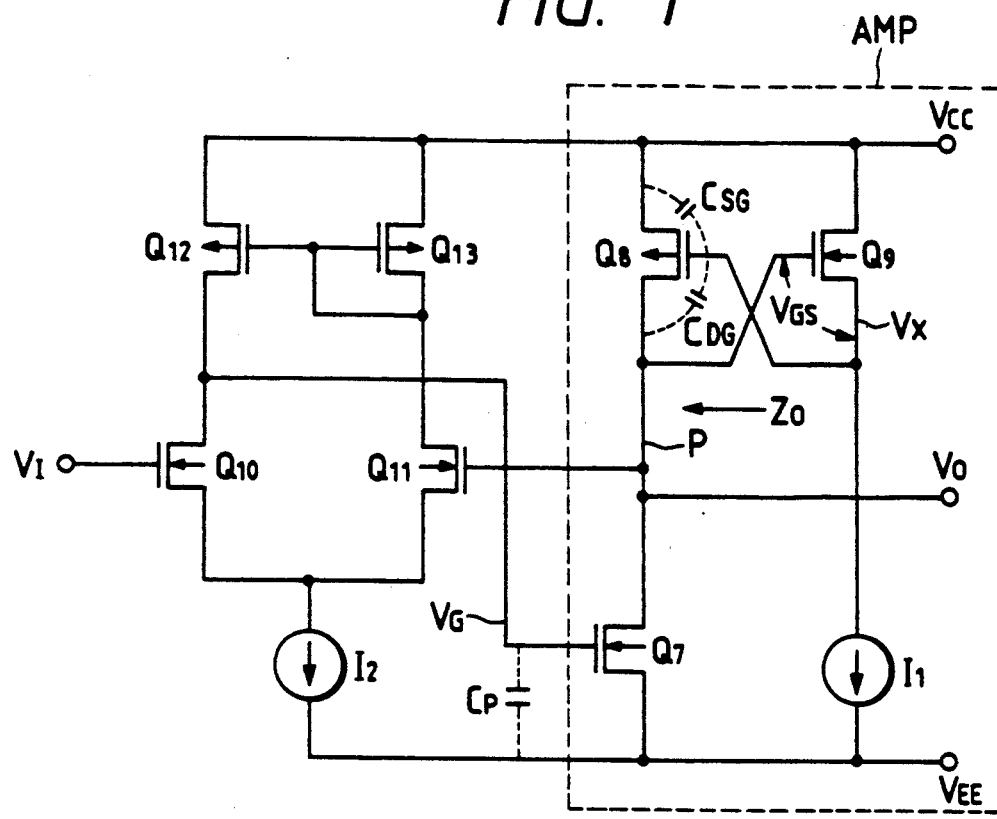
FIG. 1 is a circuit diagram showing an example of a CCD amplifier circuit according to the invention.

In FIG. 1, a circuit AMP is an essential part of the CCD amplifier circuit. The circuit AMP includes an N-channel MOS transistor $Q_7$, which has a source electrode connected to a low voltage source terminal $V_{EE}$ and a gate electrode to which a signal $V_G$ to be amplified is applied, and a P-channel MOS transistor $Q_8$, which has a drain electrode connected to a high voltage drain terminal $V_{CC}$ and a drain electrode connected to a drain electrode of the MOS transistor $Q_7$. An output signal $V_0$ is provided at the connecting point P of the two MOS transistors $Q_7$ and $Q_8$. As an example, the low voltage source terminal $V_{EE}$ can be ground and the high voltage source terminal $V_{CC}$ can be 5 volts.

The circuit AMP further includes an N-channel MOS transistor $Q_9$ having a gate electrode connected to the connecting point P, a drain electrode connected to the high voltage source terminal $V_{CC}$, and a source electrode connected to a gate electrode of the MOS transistor $Q_8$ and connected to the low voltage source terminal $V_{EE}$ through a constant current source $I_1$.

The circuit AMP thus constructed is coupled to a differential amplifier including, for instance, CMOS transistors and a constant current source, so as to be employed as a power amplifying buffer amplifier. The differential amplifier includes N-channel MOS transistors $Q_{10}$ and $Q_{11}$ forming a differential pair, a constant current source $I_2$, and P-channel MOS transistors $Q_{12}$ and $Q_{13}$ serving as an active load for the differential pair. A gate electrode of the MOS transistor $Q_{11}$ is connected to the connecting point P. A drain electrode of the MOS transistor $Q_{10}$ is connected to the gate electrode of the MOS transistor $Q_7$. An input signal $V_I$ from an external circuit is applied to a gate electrode of the MOS transistor $Q_{10}$.

The operation of the CCD amplifier circuit thus constructed is described below.

The MOS transistor $Q_9$ and the constant current circuit $I_1$ form a level shifting circuit which subjects the output signal provided at the connecting point P to power amplification and supplies the resultant output signal $V_X$ to the gate electrode of the MOS transistor $Q_8$. In the MOS transistor $Q_8$, unlike its counterpart in the conventional amplifier circuit, the gate electrode and the source electrode are not connected to each other, and instead the bias voltage between the gate electrode and the source electrode is controlled by the output signal $V_X$.

Figure 2:
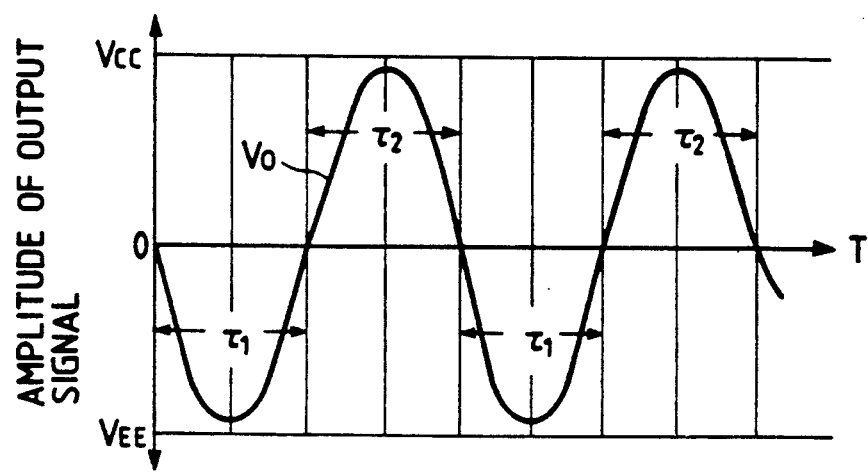
FIG. 2 is a waveform diagram illustrating features of the CCD amplifier circuit according to the invention.

In the case where the amplitude of the input signal $V_G$ goes towards the voltage $V_{CC}$, the output signal $V_0$ is inverted and amplified, as indicated in period $\tau_1$ shown in FIG. 2. Further, the output signal $V_X$ is also inverted and amplified. Thus, the MOS transistor $Q_8$ is maintained forward-biased, and the gate electrode voltage is decreased.

On the other hand, in the case where the amplitude of the input signal $V_G$ goes towards the voltage $V_{EE}$, the output signal $V_0$ is inverted and amplified, as indicated in period $\tau_2$ shown in FIG. 2, and the output signal $V_X$ also shows a waveform inverted and amplified. Thus, the gate electrode voltage of the MOS transistor $Q_8$ is increased. In this case, the output signal $V_X$ is level-shifted by an amount equal to the gate-source voltage $V_{GS}$ of the MOS transistor $Q_9$, and accordingly the gate electrode voltage of the MOS transistor $Q_8$ is lower than the voltage of the output signal $V_0$ by as much as the level-shifting voltage $V_{GS}$. Thus, the MOS transistor $Q_8$ is forward-biased at all times and never pinched off.

Accordingly, as indicated in FIG. 2, the waveform will not collapse, that is, the dynamic range is increased as compared to the dynamic ranges of conventional circuits. In addition, the mutual conductance $g_{mL}$ of the MOS transistor $Q_8$ is not decreased because the MOS transistor $Q_8$ is maintained forward-biased at all times, as described above. Therefore, as is seen from the above equations (1), (2) and (4), the output impedance $Z_0$ can be maintained low and the amplification factor $A_V$ can be increased.

The gate electrode capacitors $C_{DG}$ and $C_{SG}$ of the MOS transistor $Q_8$ are charged by the low impedance signal $V_X$. Therefore, the capacitive load of the driving MOS transistor $Q_7$ is reduced, and the high-frequency cut-off frequency $f_H$ is increased. Hence, the amplifier circuit is free from oscillations, stable in operation, and it has a wide bandwidth.

Figure 3:
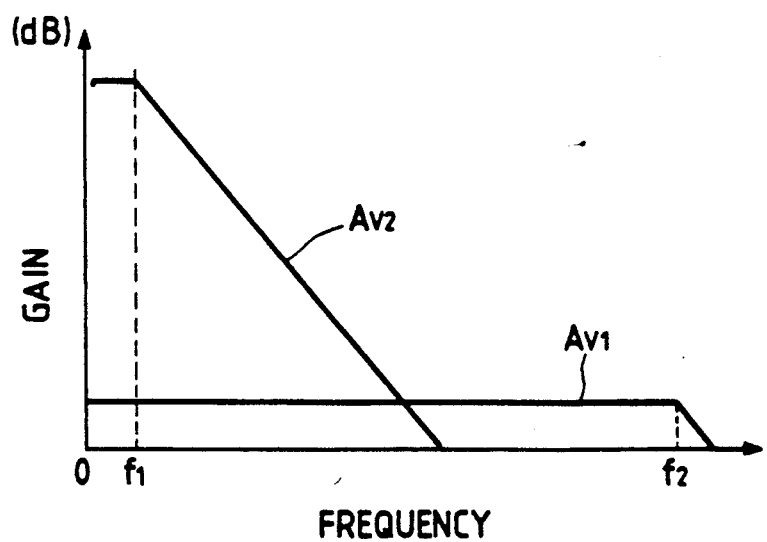
FIG. 3 is a graphical representation of operating characteristics of the CCD amplifier circuit according to the invention.

The frequency versus gain characteristic of the CCD amplifier circuit has a wide bandwidth characteristic and a high-frequency cut-off frequency $f_2$, as indicated by a characteristic curve $A_{V1}$ in FIG. 3. The frequency versus gain characteristic of the differential amplifier shows a wide bandwidth characteristic (with a high-frequency cut-off frequency $f_1$) as indicated by a characteristic curve $A_{V2}$ in FIG. 3. In the case where the output voltage $V_0$ is fed back to the differential amplifier in order to improve linearity, phase compensation can be achieved by suitably adjusting the gate-source capacitance $C_P$ of the MOS transistor $Q_7$ in such a manner as to shift the cut-off frequency $f_1$ from the cut-off frequency $f_2$.

Now, an example of a CCD delay line using a charge-coupled device will be described. The CCD delay line according to the present invention is an improvement of the CCD delay line which the present inventor has described in Japanese Patent Application No. 103100/1990.

First, the structure of the delay line will be described with reference to FIG. 4.

As shown in FIG. 4, an $N^-$ impurity ion implantation layer 2 is formed in the surface of a P-type semiconductor substrate 1, and charge transferring gate electrodes are formed thereon through a gate oxide film. Thus, a buried channel CCD (BCCD), which is the body of the delay line, is formed. In FIG. 4, gate electrodes 3, 4, 5, 6, 7 and 8 are shown as part of the output section of the BCCD, and drive signals $\phi_1$, $\phi_2$ and $\phi_{2A}$ are applied to the gate electrodes to transfer signal charges. The drive signals $\phi_1$ and $\phi_2$ are transfer clock signals in a two-phase drive system, and the drive signal $\phi_{2A}$ is a clock signal which becomes positive or negative in synchronization with the signal $\phi_2$.

A gate electrode 9 is formed adjacent the gate electrode 8. A predetermined DC voltage OG is applied to the gate electrode 9. In this example, the predetermined DC voltage OG is zero (0) volts. In addition, an $N^+$ impurity layer 10 is buried in the surface of the P-type semiconductor substrate 1 adjacent the gate-electrode 9. The impurity layer 10 is connected to an output circuit.

The output circuit of the CCD delay line includes differential amplifiers 11 and 12. The differential amplifier 11 has an inverting input terminal connected to the $N^+$ impurity layer 10, and a non-inverting input terminal receiving a predetermined bias voltage $V_B$ (e.g., 3 volts). A parallel circuit of a capacitive element 13 and an analog switch 14 is connected between the inverting input terminal and the output terminal of the differential amplifier 11. Thus, the differential amplifier 11 forms a switched-capacitance integrator.

In the differential amplifier 12, the non-inverting input terminal is connected to the output terminal of the differential amplifier 11, and the inverting input terminal is connected to an output terminal of the output circuit. Thus, the differential amplifier 12 serves as a buffer amplifier.

The output terminal of the differential amplifier 11 is connected through an analog switch 16 to the non-inverting input terminal of the differential amplifier 12. The non-inverting input to the differential amplifier 12 is grounded through a capacitive element 17. The analog switch 16 and the capacitive element 17 form a sample and hold circuit.

Figure 5:
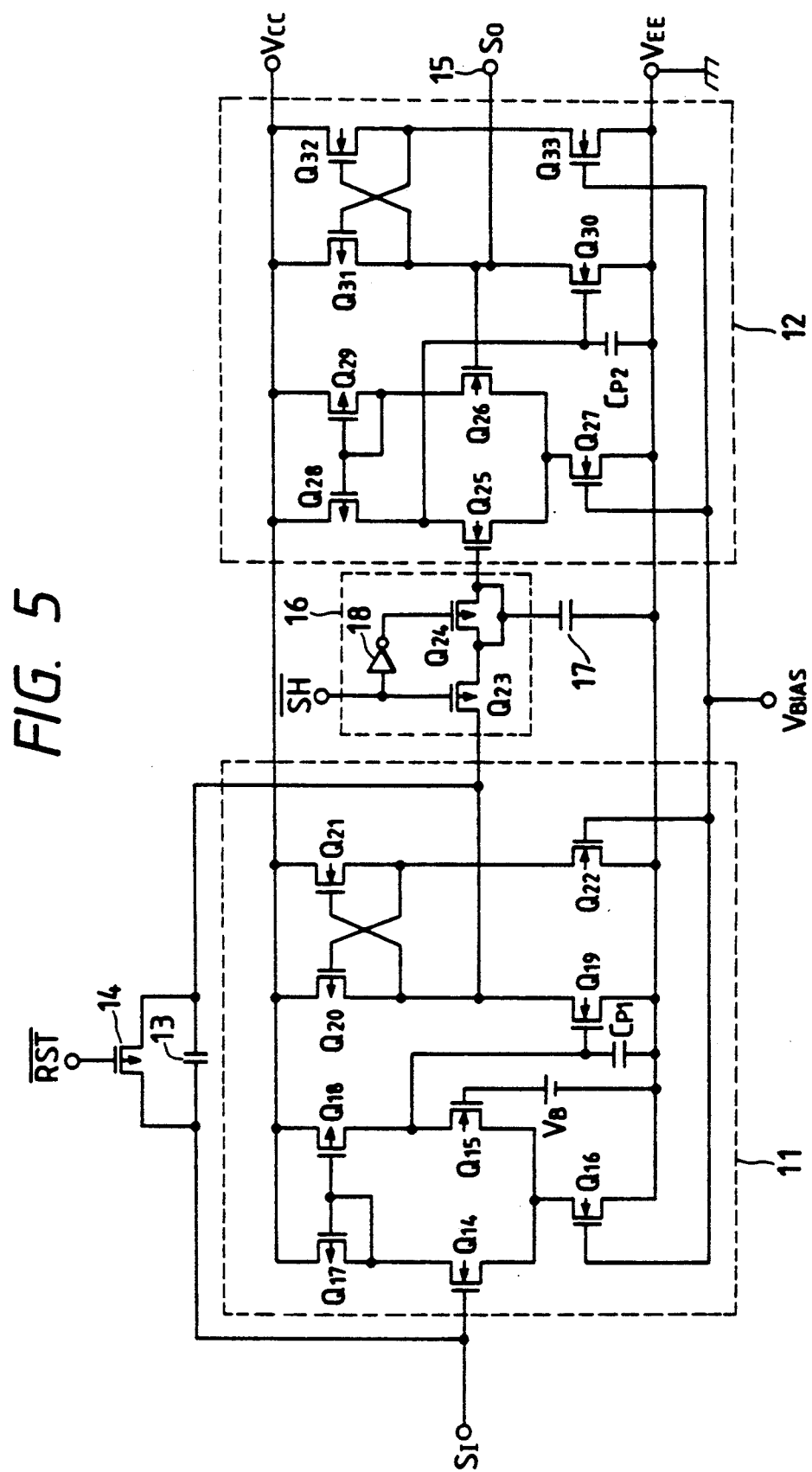
FIG. 5 is a circuit diagram illustrating the output circuit of the CCD delay line of FIG. 4A in more detail.
Figure 7:
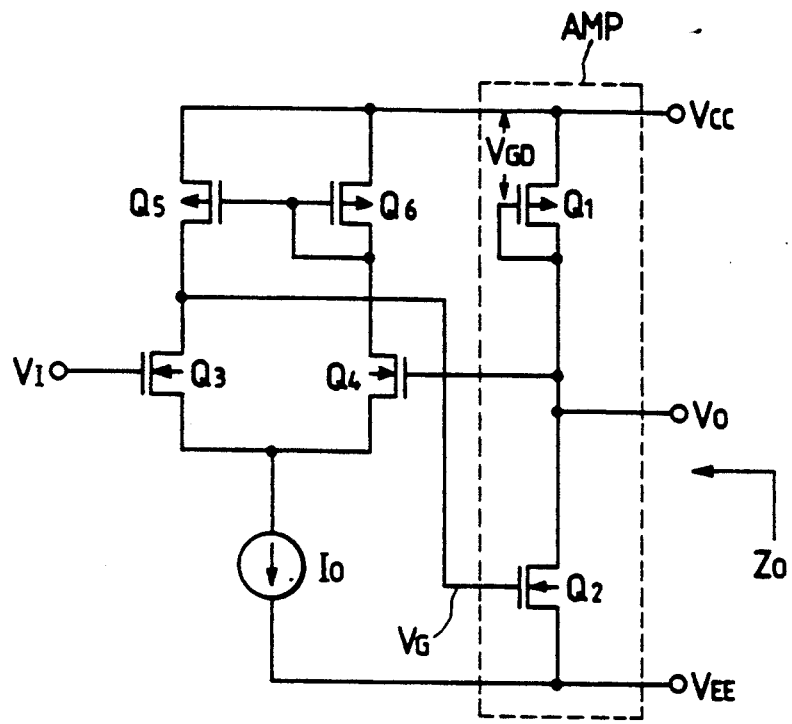
FIG. 7 is a circuit diagram showing a conventional CCD amplifier circuit.
Figure 8:
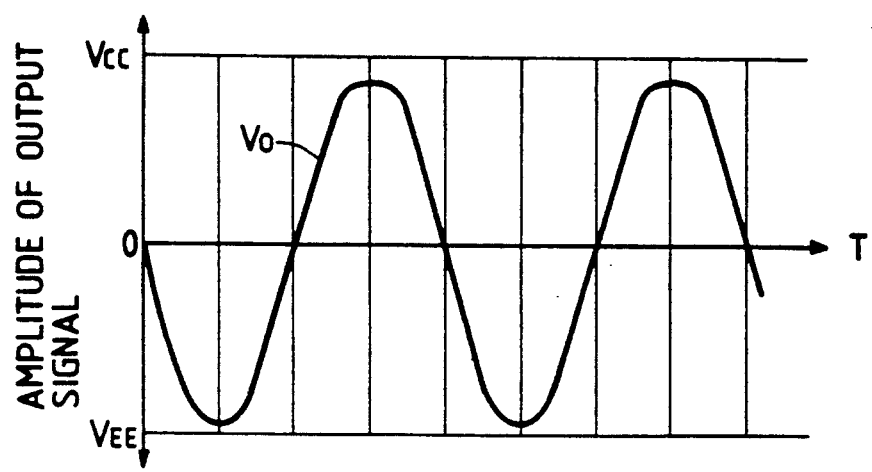
FIG. 8 is a waveform diagram illustrating problems accompanying conventional CCD amplifier circuits.

The output circuit is shown in more detail in FIG. 5. As shown in FIG. 5, the differential amplifier 11, which forms the switched capacitor integrator, includes MOS transistors $Q_{14}$ through $Q_{22}$. The analog switch 16 includes MOS transistors $Q_{23}$ and $Q_{24}$, and an inverter 18. The buffer amplifier 12 includes MOS transistors $Q_{25}$ through $Q_{33}$.

The differential amplifier 11, which forms the switched-capacitance integrator, is constructed as follows. In the differential amplifier 11, the N-channel MOS transistors $Q_{14}$ and $Q_{15}$ form a differential pair which is connected to the N-channel MOS transistor $Q_{16}$ and to the P-channel MOS transistors $Q_{17}$ and $Q_{18}$ serving as active loads. The N-channel MOS transistor $Q_{16}$ serves as a constant current source when controlled by a fixed bias voltage $V_{BIAS}$. The drain electrode of the MOS transistor $Q_{15}$ is connected to a CCD amplifier circuit (corresponding to the amplifier circuit AMP in FIG. 1) including the MOS transistors $Q_{19}$ through $Q_{22}$.

In the CCD amplifier circuit within the differential amplifier 11, the transistor $Q_{19}$ is a driving N-channel MOS transistor, the transistor $Q_{20}$ is a P-channel MOS transistor serving as an active load, and the transistors $Q_{21}$ and $Q_{22}$ are N-channel MOS transistors forming a level-shifting circuit. The N-channel MOS transistor $Q_{22}$ forms a constant current source when controlled by a fixed bias voltage $V_{BIAS}$ (e.g., $I_1$ in FIG. 1). A capacitive element $C_{P1}$ is connected between the gate electrode and the source electrode of the driving MOS transistor $Q_{19}$ for the purpose of phase compensation.

A parallel circuit of a capacitive element 13 and a P-channel MOS transistor 14 is connected between the gate electrode of the MOS transistor $Q_{14}$ and the drain electrode of the driving MOS transistor $Q_{19}$. The fixed bias voltage $V_B$ is applied to the gate electrode of the MOS transistor $Q_{15}$. The gate electrode of the MOS transistor $Q_{14}$ is connected to the floating diffusion region 10.

The analog switch 16 forming the sample-and-hold circuit includes a P-channel MOS transistor $Q_{23}$ which is rendered conductive when the sample-and-hold control signal SH is at the "L" level, a P-channel MOS transistor $Q_{24}$ serving as a gate electrode capacitor and connected to the source electrode of the MOS transistor $Q_{23}$, and an inverter 18 for inverting the sample-and-hold control signal SH and supplying the inverted signal to the gate electrode of the MOS transistor $Q_{24}$. A capacitive element 17 is connected to the source and drain electrodes of the MOS transistor $Q_{24}$. Thus, the sample-and-hold circuit is formed.

The differential amplifier 12, which forms the buffer amplifier, is constructed as follows. The N-channel MOS transistors $Q_{25}$ and $Q_{26}$ form a differential pair. The differential pair is connected to the N-channel MOS transistor $Q_{27}$, which serves as a constant current source when controlled by the fixed bias voltage $V_{BIAS}$, to the P-channel MOS transistors $Q_{28}$ and $Q_{29}$ serving as active loads. A drain electrode of the MOS transistor $Q_{25}$ is connected to the CCD amplifier circuit (corresponding to the amplifier AMP in FIG. 1).

In the CCD amplifier circuit within the differential amplifier 12, the transistor $Q_{30}$ is a driving N-channel MOS transistor, the transistor $Q_{31}$ is a P-channel MOS transistor serving as an active load, and the transistors $Q_{32}$ and $Q_{33}$ are N-channel MOS transistors forming a level-shifting circuit. The MOS transistor $Q_{33}$ forms the constant current source when controlled by the fixed bias voltage $V_{BIAS}$ (e.g., $I_1$ in FIG. 1). A capacitive element $C_{P2}$ is connected between a gate electrode and a source electrode of the driving MOS transistor $Q_{30}$ for the purpose of phase compensation.

The output signal of the sample-and-hold circuit is applied to a gate electrode of the MOS transistor $Q_{25}$, and the gate electrode of the MOS transistor $Q_{26}$ is connected directly to the output terminal of the differential amplifier 12. Thus, the differential amplifier serves as a negative feedback buffer amplifier.

Figure 6:
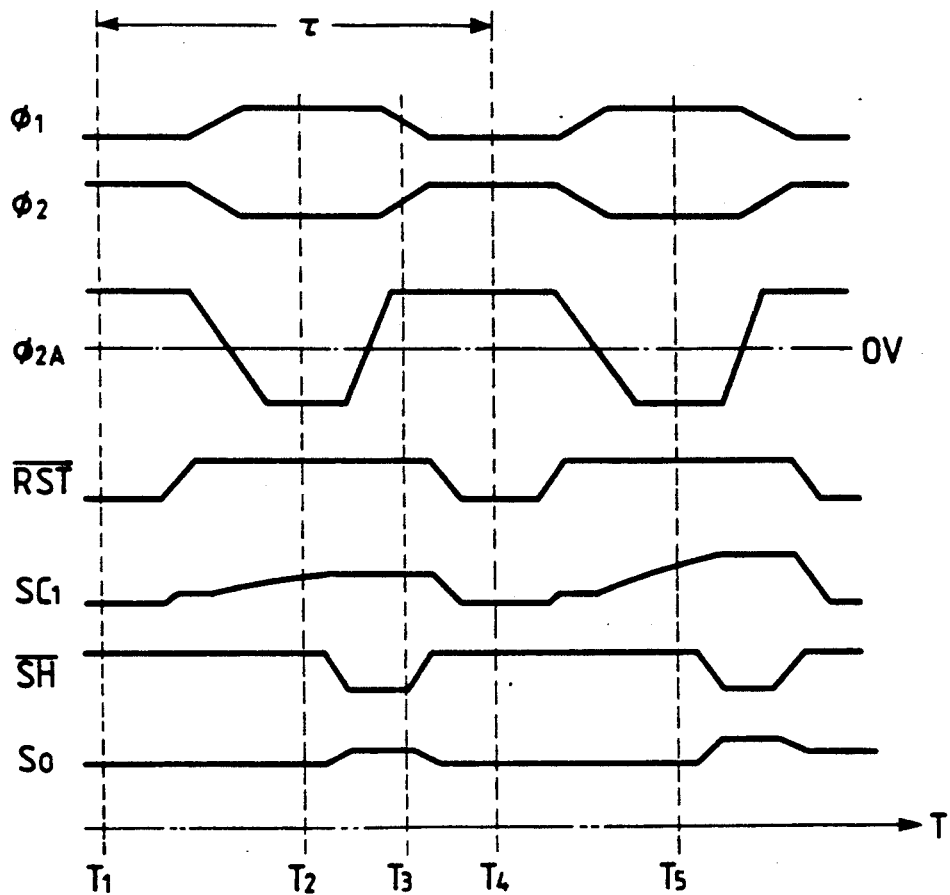
FIG. 6 is a timing chart indicating control signals for controlling the output circuit of the CCD delay line.

The operation of the CCD delay line thus constructed will be described with reference FIGS. 4B, 4C and 6. FIGS. 4B and 4C show potential profiles with respect to the gate electrodes.

In order to read signal charges transferred having a predetermined period in synchronization with the transfer clock signals $\phi_1$ and $\phi_2$, at the beginning of each period $\tau$ unnecessary charge is removed from the capacitive element 13 connected to the differential amplifier 11, and the potential of the floating diffusion region 10 is initialized. For instance, at the time instant T1 in a period $\tau$, the reset signal RST is raised to the "H" level to render the analog switch 14 conductive thereby to set the voltages at the inverting input terminal and the non-inverting input terminals of the differential amplifier 11 to $V_B$ (e.g., 3 volts). As a result, 3 volts is applied to the floating diffusion region 10. Next, the reset signal RST is set to the "H" level to render the analog switch 14 non-conductive, whereby the potential under the floating diffusion region 10 is initialized to a level corresponding to 3 volts. At the time instant T1 of the initialization, as shown in FIG. 4B, the signal charge $q_1$ closest to the output side is transferred to the region under the gate electrode 8, and the next signal charge $q_2$ is transferred to the region under the gate electrode 4.

Next, at the time instant T2 the signal $\phi_1$ is raised to the "H" level, the signal $\phi_2$ is set to the "L" level, and the signal $\phi_{2A}$ is set to the "L" level in the negative range, so that the regions under the gate electrodes 7 and 8 are reduced in potential as shown in FIG. 4C. As a result, the signal charge $q_1$ is transferred over the potential barrier under the gate electrode 9 to the floating diffusion region 10, and the signal charge $q_2$ is transferred to the region under the gate electrode 6. Hence, the signal charge $q_1$ thus transferred charges the capacitive element 13, so that the output signal $SC_1$ of the differential amplifier 11 changes as shown in FIG. 6.

Next, at the time instant T3, the sample and hold signal SH is set to the "L" level. Hence, the output signal $SC_1$ of the differential amplifier 11 is held by the capacitive element 17, and an output signal $S_0$ proportional to the signal thus held is provided at the output terminal 15 by the differential amplifier 12.

At the time instant T4, the same operations are carried out as at the time instant T1, the next signal charge transferred next is read, and similarly the process for the period $\tau$ is performed. Thus, signal charges which are successively transferred are read out.

As described above, in the CCD delay line, the output stages of the switched capacitor integrator and the buffer amplifier in the output circuit are implemented with the CCD amplifier circuit according to the invention. Hence, the output circuit is low in output impedance and wide in bandwidth thus being suitable for processing video signals.

As described above, with the CCD amplifier circuit of the invention, even when the output signal increases in voltage amplitude, neither is the mutual conductance of the active load MOS transistor decreased nor is the pinch-off voltage decreased because a forward bias voltage is always applied between the gate and source electrode of the active load MOS transistor. Furthermore, the gate capacitance of the active load MOS transistor is charged by the control signal of low output impedance provided by a control circuit, and thus the active load MOS transistor does not become a capacitive load for the driving MOS transistor. Hence, the waveform of the output signal does not collapse due to the effect of the pinch-off voltage because the dynamic range is increased. In addition, the output impedance is not increased, and the high-frequency cut-off frequency can be increased. Hence, the resultant CCD amplifier circuit has a wide bandwidth.

Furthermore, a CCD delay line capable of processing video signals over a wide frequency range can be formed by applying the inventive CCD amplifier to its output circuit.

While the invention has been described in connection with the preferred embodiments of the invention, it will be obvious to those skilled in the art that various changes and modifications may be made therein without departing from the invention, and it is intended, therefore, to cover in the appended claims all such changes and modifications which fall within the true spirit and scope of the invention.

What is claimed is:

1. An analog CCD amplifier circuit, comprising:
   an active load type source-grounded inverting amplifier circuit comprising:
   a driving MOS transistor having a gate electrode connected to receive an input, and
   an active load MOS transistor, connected to said driving MOS transistor at a connecting point, for inverting and amplifying the input signal at the connecting point; and
   a control circuit for applying a control signal to a gate electrode of said active load MOS transistor, said control circuit having a low output impedance and the control signal being substantially inversely proportional to a drain-source voltage of said active load MOS transistor and being level-shifted by a predetermined voltage.

2. A CCD amplifier circuit, comprising:
   an active load type source-grounded inversion amplifier circuit comprising:
   a driving MOS transistor having a gate electrode to which a signal to be amplified is applied, and
   an active load MOS transistor, connected to said driving MOS transistor at a connecting point, for providing an inverted and amplified signal at the connecting point, said active load MOS transistor having a gate electrode for receiving an output signal;
   a constant current source; and a level shifting circuit having a gate electrode which receives said inverted and amplified signal, and a source electrode connected to said constant current source and said gate electrode of said active load MOS transistor, said level-shifting circuit applying said output signal to said gate electrode of said active load MOS circuit via said source electrode of said level shifting circuit.

3. An amplifier for amplifying a received signal to produce an amplified signal at an output terminal, said amplifier comprising:
    an active load type inverting circuit having a driving transistor and an active load transistor, each of said transistors having a gate, a drain and a source terminal, said drain terminal of said active load transistor being connected to said drain terminal of said driving transistor at said output terminal; and
    a level shifting transistor having a first terminal and a second terminal, said first terminal being connected to said output terminal to receive said amplified signal, said second terminal being connected to said gate terminal of said active load transistor, said level shifting transistor level shifting said amplified signal to produce a control signal at said second terminal each of said active load and level shifting transistors being one of P- and N-type MOS transistors, and said active load type transistor being a different type MOS transistor than said level shifting transistor.

4. An amplifier as recited in claim 3, wherein said level-shifting circuit levels shifts said amplified signal by a predetermined amount to produce said control signal.

5. An amplifier receiving a signal to be amplified to produce an amplified signal at an output terminal, said amplifier comprising:
    a driving transistor having drain, gate and source terminals, said gate terminal receiving said signal to be amplified, said source terminal being connected to a low voltage source terminal, and said drain terminal being connected to said output terminal;
    a control transistor having drain, gate and source terminals, said gate terminal of said control transistor being connected to said output terminal, said drain terminal of said transistor being connected to a high voltage source terminal, and said source terminal outputting a control signal; and
    an active load transistor for outputting an amplified signal in accordance with said control signal, said active load transistor comprising drain, gate and source terminals, said source terminal of said active load transistor being connected to said high voltage source terminal, said drain terminal of said active load transistor being connected to said output terminal for outputting said amplified signal, said gate terminal of said active load transistor being connected to said source terminal of said control transistor to receive said control signal, each of said active load and control transistors being one of N- and P-type MOS transistors, and said active load transistor being a different type MOS transistor than said control transistor.

6. An amplifier as recited in claim 5, wherein said amplifier further comprises a constant current source connected between said source terminal of said control transistor and said low voltage source terminal.

7. An amplifier as recited in claim 5, wherein said output terminal has a low impedance and said control signal is substantially inversely proportional to a drain-source voltage of said active load transistor.

8. An amplifier as recited in claim 5, wherein said driving transistor is a MOS transistor.

9. An amplifier as recited in claim 5, further comprising a differential amplifier connected to said amplifier, said differential amplifier supplying a signal to be amplified to said amplifier.

10. An analog amplifier for amplifying a received signal to produce an amplified signal at an output terminal, said amplifier comprising:
    a driving transistor having a gate terminal for receiving said received signal, and a drain terminal connected to said output terminal;
    a level shifting transistor for level shifting the amplified signal by a predetermined voltage to produce a control signal; and
    an active load transistor having a gate terminal for receiving said control signal and a source terminal connected to said output terminal for providing said amplified signal at the output terminal, each of said level shifting and active load transistors being one of N- and P-type MOS transistors, and said level shifting transistor being a different type MOS transistor than said active load transistor.

11. An amplifier as recited in claim 10, wherein said output terminal has a low output impedance and the control signal is substantially inversely proportional to a drain-source voltage of said active load transistor.

12. An amplifier as recited in claim 10, wherein said amplifier is a CCD amplifier, and wherein said driving transistor is an MOS transistor.

13. An amplifier as recited in claim 10, wherein said amplifier further comprises a capacitor connected to said gate terminal of said driving transistor for phase compensation.

14. A CCD delay line for a charge-coupled device, comprising:
    a floating diffusion region of predetermined impurities formed at an end of said charge-coupled device having a gate section with a predetermined fixed gate voltage; and
    a switched capacitor integrator for detecting injection charge of said floating diffusion region so that signal charges transferred to said floating diffusion region from said charge-coupled device are detected, said switched capacitor integrator having an output circuit comprising a CCD amplifier circuit, said CCD amplifier circuit comprising an active load type inverting amplifier circuit comprising:
    a driving MOS transistor having a gate electrode to which a signal to be amplified is applied, and
    an active load MOS transistor connected to said driving MOS transistor at a connecting point for providing an inverted and amplified signal at said connecting point; and
    a control circuit for applying a control signal to a gate electrode of said active load MOS transistor, said inverting amplifier circuit having a low output impedance and the control signal being substantially inversely proportional to a drain-source voltage of said active load MOS transistor and level-shifted by a predetermined voltage.

15. A CCD delay line for a charge-coupled device, comprising:
    a floating diffusion region of predetermined impurities) formed at an end of said charge-coupled device having a gate section with a predetermined fixed gate voltage;

a switched capacitor integrator for detecting injection charge of said floating diffusion region so that signal charges transferred to said floating diffusion region from said charge-coupled device are detected, said switched capacitor integrator comprising an output circuit comprising a CCD amplifier circuit, said CCD amplifier circuit comprising an active load type inversion amplifier circuit comprising:

a driving MOS transistor having a gate electrode to which a signal to be amplified is applied, and an active load MOS transistor connected to said driving MOS transistor at a connecting point for providing an inverted and amplified signal at said connecting point, said active load MOS transistor having a gate electrode receiving an output signal;

a constant current source; and a level-shifting circuit having a gate electrode which receives said inverted and amplified signal, and a source electrode connected to said constant current source and said gate electrode of said active load MOS transistor, said level-shifting circuit outputting said output signal to said gate electrode of said active load MOS circuit via said source electrode of said level-shifting circuit.

16. A CCD delay line for a charge-coupled device having a gate section with a predetermined gate voltage, said CCD delay line comprising:

a floating diffusion region of predetermined impurities formed at an end of said charge-coupled device having said gate section; and a switched capacitor integrator for detecting an injection charge of said floating diffusion region so that signal charges transferred to said floating diffusion region from said charge-coupled device are detected, said switched capacitor integrator comprising a CCD amplifier for amplifying a received signal to produce an amplified signal at an output terminal, said CCD amplifier comprising:

a driving transistor having a gate terminal for receiving said received signal, and a drain terminal connected to said output terminal;

level-shifting means for level shifting said amplified signal by a predetermined voltage to produce a control signal; and an active load transistor having a gate terminal for receiving said control signal and a drain terminal connected to the output terminal for providing said amplified signal at said output terminal.

17. A CCD delay line as recited in claim 16, wherein said driving transistor and active load transistor are MOS transistors.

18. A CCD delay line for a charge-coupled device having a gate section with a predetermined gate voltage, said CCD delay line comprising:

a floating diffusion region of predetermined impurities formed at an end of said charge-coupled device having said gate section; and a switched capacitor integrator for detecting an injection charge of said floating diffusion region so that signal charges transferred to said floating diffusion region from said charge-coupled device are detected, said switched capacitor integrator comprising a CCD amplifier for amplifying a received signal to produce an amplified signal at an output terminal, said CCD amplifier comprising:

an active load type inverting circuit having a driving transistor and an active load transistor, each of said driving and active load transistors have a gate, a drain and a source terminal, said drain terminal of said active load transistor being connected to said drain terminal of said driving transistor at said output terminal; and a level-shifting circuit having a first terminal and a second terminal, said first terminal being connected to said output terminal to receive said amplified signal, said second terminal being connected to said gate terminal of said active load transistor, said level-shifting circuit level shifting said amplified signal to produce a control signal, and said control signal being output at said second terminal.

19. A CCD delay line as recited in claim 18, wherein said level-shifting circuit level shifts said amplified signal by a predetermined amount to produce said control signal.

20. A CCD delay line as recited in claim 18, wherein said CCD amplifier further comprises a capacitor connected to said gate terminal of said driving transistor for phase compensation.

* * * * *